(12) United States Patent
Shang et al.

(10) Patent No.: US 6,887,776 B2
(45) Date of Patent: May 3, 2005

(54) METHODS TO FORM METAL LINES USING SELECTIVE ELECTROCHEMICAL DEPOSITION

(75) Inventors: Quanyuan Shang, Saratoga, CA (US); John M. White, Hayward, CA (US); Robert Z. Bachrach, Burlingame, CA (US); Kam S. Law, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/412,620

(22) Filed: Apr. 11, 2003

(65) Prior Publication Data

US 2004/0203181 A1 Oct. 14, 2004

(51) Int. Cl.$^7$ .............................................. H01L 21/44
(52) U.S. Cl. ..................... 438/612; 438/626; 438/396; 438/678; 438/393; 257/532; 257/43; 257/307; 257/535; 257/640; 257/751; 257/762
(58) Field of Search ................................ 438/612, 626, 438/396, 678, 393; 257/532, 43, 307, 535, 640, 751, 762

(56) References Cited

U.S. PATENT DOCUMENTS

| | | |
|---|---|---|
| 5,235,139 A | 8/1993 | Bengston et al. ............ 174/257 |
| 5,370,766 A | 12/1994 | Desaigoudar et al. ........ 156/643 |
| 5,380,560 A | 1/1995 | Kaja et al. ................... 427/306 |
| 5,510,216 A | 4/1996 | Calabrese et al. ............ 430/16 |
| 5,529,863 A | 6/1996 | Swirbel et al. ............... 430/20 |
| 5,545,927 A * | 8/1996 | Farooq et al. ............... 257/762 |
| 5,755,859 A | 5/1998 | Brusic et al. |
| 5,789,320 A | 8/1998 | Andricacos et al. ......... 438/678 |
| 5,871,655 A | 2/1999 | Lee et al. ...................... 216/22 |
| 5,898,222 A * | 4/1999 | Farooq et al. ............... 257/762 |
| 6,091,488 A | 7/2000 | Bishop |
| 6,114,097 A * | 9/2000 | Malba et al. ................. 430/314 |
| 6,180,523 B1 | 1/2001 | Lee et al. ...................... 438/678 |
| 6,255,187 B1 | 7/2001 | Horii ............................ 438/396 |
| 6,265,086 B1 | 7/2001 | Harkness ..................... 428/626 |
| 6,326,303 B1 | 12/2001 | Robinson et al. |
| 6,426,281 B1 | 7/2002 | Lin et al. ...................... 438/612 |
| 6,436,816 B1 | 8/2002 | Lee et al. |
| 6,486,530 B1 * | 11/2002 | Sasagawa et al. ........... 257/532 |

(Continued)

FOREIGN PATENT DOCUMENTS

| | | | |
|---|---|---|---|
| EP | 0 386 459 | 9/1990 | |
| EP | 1 369 928 A1 | 12/2003 | |
| JP | 02-083533 | 3/1990 | |
| JP | 04-302436 | 10/1992 | |
| WO | WO 00/54339 A | 9/2000 | |
| WO | 00/59645 | 10/2000 | ............ B05D/5/12 |
| WO | WO 02/67335 A | 8/2002 | |

OTHER PUBLICATIONS

David Clegg, et al., "Flip Chip Interconnect (C4 makes way for electroplated bumps)", pp.:1–5.
K.K.H. Wong, et al., "Metallization by Plating for HighPerformance Multichip Modules" pp.: 1–7.
Haruo Akahoshi, et al., "IEEE Transactions on Components, Packaging, and Manufacturing Technology" Part A. vol. 18, No. 1, Mar. 1995) for semiconductor or PCB fabrications.
PCT International Search Report and Written Opinion, dated Sep. 14, 2004 (AMAT/8029.PC).

*Primary Examiner*—Matthew Smith
*Assistant Examiner*—Victor V Yevsikov
(74) *Attorney, Agent, or Firm*—Moser, Patterson & Sheridan LLP

(57) ABSTRACT

Methods are provided for forming a transistor for use in an active matrix liquid crystal display (AMLCD). In one aspect a method is provided for processing a substrate including providing a glass substrate, depositing a conductive seed layer on a surface of the glass substrate, depositing a resist material on the conductive seed layer, patterning the resist layer to expose portions of the conductive seed layer, and depositing a metal layer on the exposed portions of the conductive seed layer by an electrochemical technique.

22 Claims, 9 Drawing Sheets

U.S. PATENT DOCUMENTS

| | | |
|---|---|---|
| 6,515,336 B1 | 2/2003 | Suzawa et al. ............. 257/350 |
| 6,624,473 B1 | 9/2003 | Takehashi et al. |
| 6,656,827 B1 * | 12/2003 | Tsao et al. ................. 438/612 |
| 2001/0023771 A1 | 9/2001 | Izumi et al. |
| 2001/0055851 A1 | 12/2001 | Horii ......................... 438/393 |
| 2002/0127833 A1 | 9/2002 | Izumi et al. |
| 2002/0127836 A1 | 9/2002 | Lin et al. .................... 438/612 |
| 2003/0038037 A1 | 2/2003 | Colgan et al. |
| 2003/0104649 A1 * | 6/2003 | Ozgur et al. .................. 438/50 |
| 2003/0116439 A1 | 6/2003 | Seo et al. |
| 2004/0026786 A1 * | 2/2004 | Leu et al. ................... 257/758 |

* cited by examiner

METHODS TO FORM METAL LINES USING SELECTIVE ELECTROCHEMICAL DEPOSITION

BACKGROUND OF THE INVENTION

1. Field of the Invention

Embodiments of the present invention generally relate to a process for depositing a metal on a substrate.

2. Description of the Related Art

Active matrix liquid crystal displays have become the display technology of choice for numerous applications including computer monitors, television screens, camera displays, avionics displays, as well as numerous other applications. Active matrix liquid crystal displays generally comprise an array of picture elements called pixels. An electronic switch is associated with each pixel in the display to control the operation thereof. Various electronic switches such as, for example, thin film transistors and organic light emitting diodes (OLED), have been investigated to control pixel operation. Thin film transistors (TFT). in particular, offer a high degree of design flexibility and device performance. Thin film transistors are generally formed on large area substrates having a high degree of optical transparency such as glass.

FIG. 1 depicts a cross-sectional schematic view of a thin film transistor 1 having a bottom gate structure. The thin film transistor 1 includes a glass substrate 10 having an optional underlayer 20 formed thereon. A gate is formed on the underlayer 20. The gate comprises a gate metal layer 30 and a gate dielectric layer 40. The gate controls the movement of charge carriers in the transistor. The gate dielectric layer 40 electrically isolates the gate metal layer 30 from semiconductor layers 50 and 70 (70a, 70b), formed thereover, each of which may function to provide charge carriers to the transistor.

An interlayer dielectric/etch stop layer 60 is formed on semiconductor layer 50 to isolate source and drain aspects of semiconductor layer 70 and conductive layer 80. Source and drain structures comprise a source contact 80a disposed on source region 70a and drain contact 80b disposed on drain region 70b. Finally, a passivation layer 90 encapsulates the thin film transistor 1 to protect the transistor from environmental hazards such as moisture and oxygen.

The gate metal layer 30 generally comprises a conductive material, of which copper and copper alloys have become the metals of choice for TFT technology since copper has a lower resistivity than aluminum, (1.7 $\mu\Omega$-cm for copper compared to 3.1 $\mu\Omega$-cm for aluminum), a higher current carrying capacity and significantly higher electromigration resistance. These characteristics are important for supporting the current densities experienced at high levels of integration across large areas (i.e., glass substrates). Further, copper has a good thermal conductivity and is available in a highly pure state.

Conventionally, copper is deposited onto materials using physical vapor deposition (PVD) techniques. However, gate material layers deposited using PVD techniques generally tend to have higher resistivities than desired for device performance, which may affect the electrical performance of the transistors, including device reliability and premature failure.

Additionally, copper may be deposited on materials, such as dielectric materials, that vary by physical characteristics and the adhesion of copper to the dielectric materials can be problematic. Copper materials have also been observed to delaminate and flake from the surfaces of some underlying materials. In addition, copper may not deposit to particular surfaces since nucleation sites may not be available.

Other techniques to deposit copper, such as by chemical vapor deposition often result in blanket deposition of copper that must be removed to form selected features. Copper is also known as being difficult to etch from the surface of a substrate, and removal of copper may result in defect formation and damage to the underlying substrate. Additionally, copper is difficult to pattern and techniques, such as damascene or dual damascene formation, to form patterned copper features, have not been found or not considered suitable for forming TFTs.

Therefore, there is a need for a method of selectively depositing a metal material on a substrate.

SUMMARY OF THE INVENTION

Aspects of the invention generally provide methods for forming semiconductor devices on flat panel displays. In one aspect, a method is provided for forming a transistor for use in an active matrix liquid crystal display (AMLCD) including providing a glass substrate, depositing a conductive seed layer on a surface of the glass substrate, depositing a resist material on the conductive seed layer, patterning the resist layer to expose portions of the conductive seed layer, and depositing a metal layer on the exposed portions of the conductive seed layer by an electrochemical technique.

In another aspect, a method is provided forming a transistor for use in an active matrix liquid crystal display (AMLCD) including providing a glass substrate, depositing a conductive seed layer on a surface of the glass substrate, depositing a resist material on the conductive seed layer, patterning the resist layer to expose the conductive seed layer, etching exposed portions of the conductive seed layer, removing the resist material, and depositing a metal layer on remaining portions of the conducive seed layer by an electrochemical process.

In another aspect, a method is provided forming a transistor for use in an active matrix liquid crystal display (AMLCD) including providing a glass substrate, forming one or more doped semiconductor layers having source regions and drain regions formed therein, forming one or more gate dielectric layers on the one or more doped semiconductor layers, forming one or more metal gates on the one or more gate dielectric layers by electrochemical deposition of a metal layer on a seed layer patterned by a resist patterning technique, depositing an interlayer dielectric material on the substrate and over the one or more metal gates, patterning one or more gate dielectric layers and the interlayer dielectric material to form feature definitions exposing underlying source regions and drain regions, and depositing a metal layer in the feature definitions to form a contact.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Methods for forming gate metal layers for use in forming a transistor for use in an active matrix liquid crystal display (AMLCD), including thin film transistors, are described.

Figure 1:
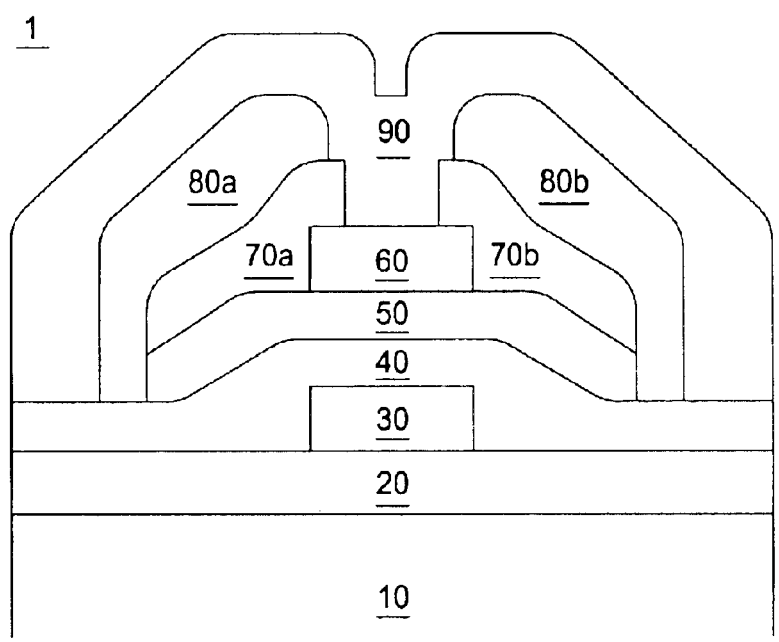
FIG. 1 depicts a cross-sectional schematic view of a prior art bottomgate thin film transistor.
Figure 2:
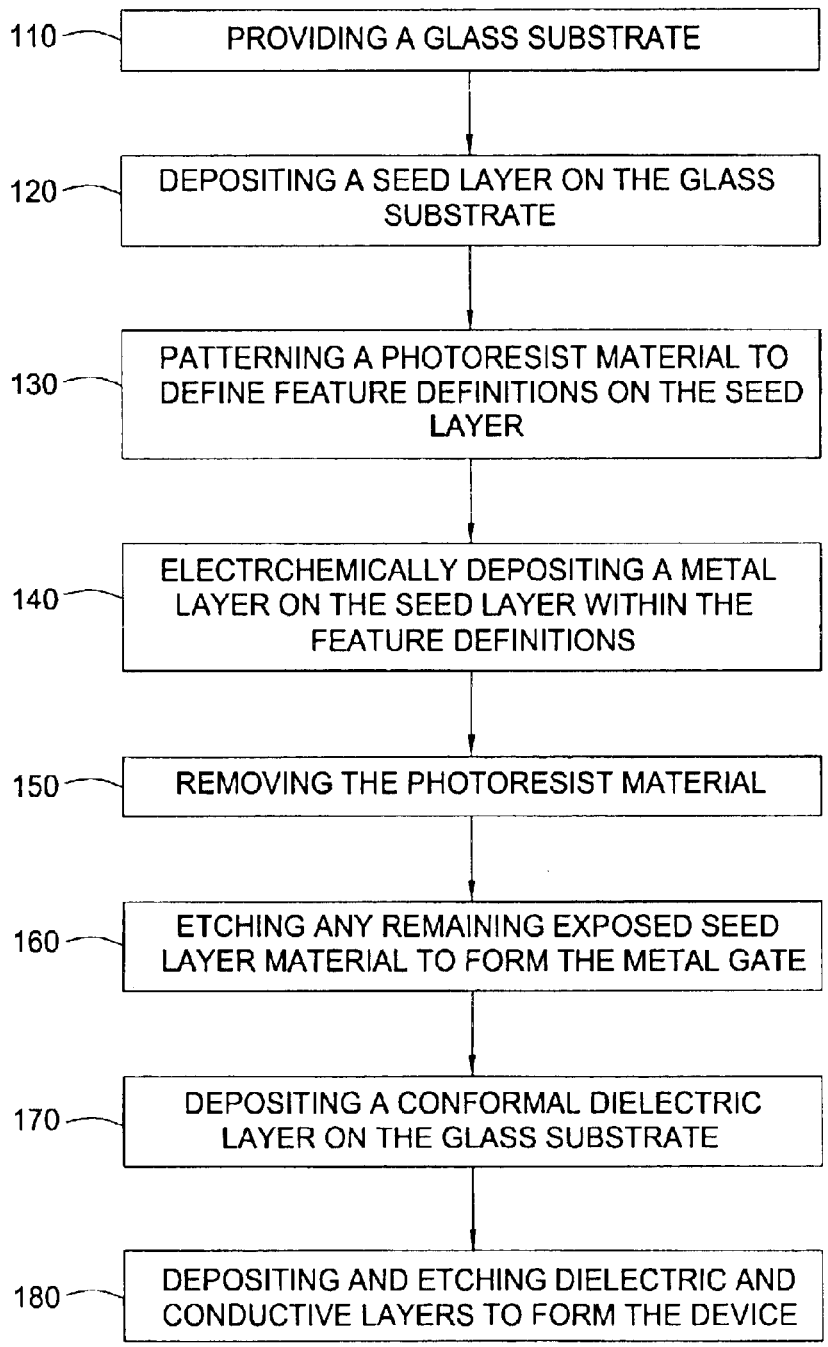
FIG. 2 is a flow chart illustrating steps undertaken in depositing layers according to an embodiment of the invention.

FIG. 2 is a flow chart illustrating steps taken in processing a substrate according to an embodiment of the invention. The process 100 for selectively depositing a metal layer is described as follows. A glass substrate is provided to a processing apparatus at step 110. A nucleation or seed layer of a metal material is deposited on the glass substrate at step 120. A resist material is patterned to expose portions of the underlying seed layer at step 130. A metal layer is then selectively deposited on the exposed portions of the seed layer by an electrochemical deposition process at step 140. The resist material is then removed from the glass substrate to form a feature extending above the plane of the glass substrate at step 150. Exposed portions of the seed layer may then be removed at step 160. A dielectric layer is then deposited on the glass substrate at step 170. Further deposition, patterning, and removal of material may then occur to form the thin film transistor (TFT) at step 180.

FIGS. 3A–3J are cross-sectional views of one example of forming a thin film transistor with a selectively deposited metal material according to the process 100 illustrated in the flow chart of FIG. 2.

Figure 3A:
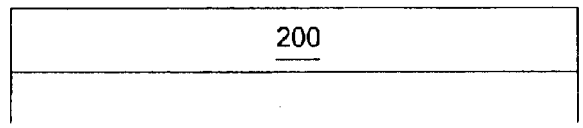
FIGS. 3A–3J are cross-sectional views of layering steps in one embodiment of the invention.

Initially, a substrate 200 is provided to deposit material thereon at step 110 as shown in FIG. 3A. The substrate 200 may comprise undoped silica glass (USG), phosphorus doped glass (PSG), boron-phosphorus doped glass (BPSG), soda-lime glass, borosilicate glass, sodium borosilicate glass, alkali-metal borosilicate, aluminosilicate glass, aluminoborosilicate glass, alkaline earth aluminoborosilicate glass, alkaline earth-metal aluminoborosilicate glass, or combinations thereof, among others, for the formation of TFT's in, for example, AMLCD fabrication. The substrate 200 may also be referred to as glass panels, flat panels, or flat panel displays, and may be in various sizes and shapes, for example, a square shaped glass panel having sides of 500 mm by 500 mm or greater may be used.

Glass substrates with preferred glass properties or compositions may be selected for forming particular semiconductor devices. For example, a special formulation of alkaline earth glass, such as alkaline earth-metal aluminosilicate glass, may be used for AMLCD displays to minimize doping or contamination of alkali metals or boron in transistors formed in a polysilicon film. The presence of alkali or boron contaminants may degrade transistor performance. However, the above list of materials is illustrative and it is contemplated that the glass substrate 200 may comprise other commercially available glasses and dopant materials known or unknown art for producing glass substrate for flat panel displays.

Alternatively, the processes described herein may be used for other applications on substrates comprising silicon, doped silicon, silicon dioxide, silicon germanium, or doped variations thereof, among others, may be used. Prior to deposition of material thereon, the substrate surface may be exposed to a cleaning process, such as a plasma clean to remove oxides, which clean may be performed in situ with the deposition of materials.

Figure 3B:
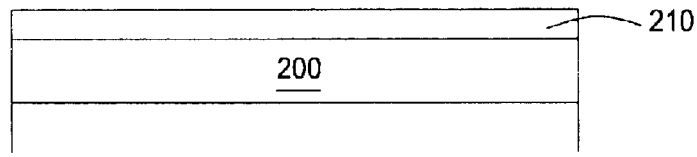

A seed layer 210 is deposited on the substrate surface at step 120, as shown in FIG. 3B. A seed layer is broadly defined herein as continuously or discontinuously deposited material used to promote or facilitate growth of subsequently deposited layers on a substrate surface and to enhance interlayer adhesion of deposited layers. The seed layer 210 may also serve as a barrier layer to reduce or inhibit metal diffusion, such as copper diffusion, into underlying layers, as well as improve adhesion between the underlying materials and subsequently deposited materials.

The seed layer 210 may comprise a metal or metal-containing material. Examples of suitable seed materials include copper, nickel, tungsten, molybdenum, cobalt, ruthenium, titanium, zirconium, hafnium, niobium, tantalum, vanadium, chromium, manganese, iron, palladium, platinum, aluminum, and combinations thereof. Alloys and doped derivatives of metals described herein may also be used to form the seed layer 210. The seed layer 210 may be doped, for example, with phosphorus, boron, tungsten, molybdenum, rhenium, and combinations thereof, among others. For example, cobalt, cobalt alloys, such as cobalt-tungsten, and doped cobalt, with boron and/or phosphorus, and combinations thereof, may be used as a seed layer 210. Tertiary compounds, such as cobalt-tungsten-phosphorus may also be deposited as the seed layer 210. The invention contemplates that any material suitable for catalyzing or nucleating an electrochemical deposition process may be used, for example, an organic ligand material that initiates metal deposition may be used.

The seed layer 210 may be deposited by a thermal or plasma chemical vapor deposition (CVD) technique, atomic layer deposition (ALD) techniques, metal evaporation techniques, and electroless deposition techniques, such as electroless deposition. Alternatively, the seed layer 210 may be deposited by physical vapor deposition (PVD) techniques, such as ionized metal plasma physical vapor deposition (IMP-PVD) and collimated or long throw sputtering.

While not shown, an optional barrier layer of material may be deposited on the glass substrate 200 prior to deposition of the seed layer 210. The optional barrier layer may prevent diffusion of alkali ions Into the seed layer 210 and prevent diffusion of seed layer materials into the underlying glass substrate 200. The optional barrier layer typically comprises one or more dielectric materials, for example, silicon oxide, silicon nitride, silicon carbide, nitrogen and oxygen doped silicon carbide, and combinations thereof.

Figure 3C:
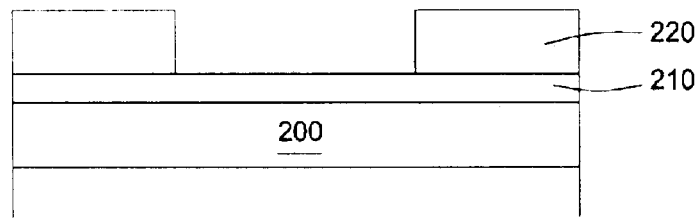

A resist layer 220 may then be patterned on the seed layer 210 to expose underlying material of the seed layer 210 at step 130 as shown in FIG. 3C. In one resist patterning process, a photoresist material is deposited, exposed to an energy source, such ultraviolet light, through a patterned reticle to modify a portion of the photoresist, and then chemically treated or developed to remove modified or unmodified portions of the photoresist material.

Examples of suitable resists include ZEP, a resist material commercially available from Tokyo-Oka of Japan, or a chemically amplified resist (CAR) also commercially available from Tokyo-Oka of Japan, which can be deposited on the seed layer 210 and then patterned using conventional laser or electron beam patterning equipment. The resist layer 220 may be deposited on the substrate 200, for example, between about 1000 angstroms (A) and about 6000 Å thick, such as between about 2000 Å and about 4000 Å thick, but may be of any thickness desired. The resist material is then treated with a developing solution, such as an alkaline solution or amine solution, to remove the modified photoresist material and expose the underlying seed layer 210. While the following description illustrates the use of a positive photoresist, the invention contemplates that a negative photoresist or other resist material, such as an e-beam resist, known or unknown, may be used.

Figure 3D:
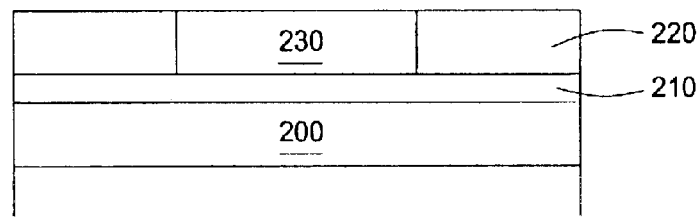

The substrate 200 may then be introduced into an apparatus and a metal layer 230 deposited on the seed layer 210 by an electrochemical process at step 140 as shown in FIG. 3D. The electrochemical process may include electroless deposition or electroplating techniques. The metal layer 230 may be any material suitable for deposition from an electrochemical process, for example, copper, nickel, cobalt, palladium, tin, titanium, tantalum, tungsten, molybdenum, platinum, iron, niobium, and combinations thereof, including alloys, may be used. The metal layer 230 may be doped, for example, with phosphorus, boron, tungsten, molybdenum, rhenium, and combinations thereof, among others. The metal layer 230 may also comprise the same material as the seed layer 210. For example, a copper metal layer may be deposited on a copper seed layer. The metal layer 230 may be deposited to a desired thickness, for example, between about 0.01 μm and about 2 μm or about 100 Å and 20,000 Å.

Examples of suitable electroless plating techniques are provided In commonly assigned U.S. Pat. No. 6,258,223, entitled "In-Situ Electroless Copper Seed Layer Enhancement In An Electroplating System," filed on Jul. 9, 1999, and in co-pending U.S. publication No. 20020152955, entitled "Apparatus And Method For Depositing An Electroless Solution," filed on Dec. 30, 1999, which are hereby incorporated by reference to the extent not inconsistent with the claimed aspects and disclosure herein.

Examples of suitable electroplating techniques are provided in commonly assigned U.S. Pat. No. 6,258,220, entitled "Electro-chemical Deposition System," and in co-pending U.S. patent application Ser. No. 09/245,780, entitled "Electrodeposition Chemistry for Improved Filling of Apertures," filed on Feb. 5, 1999, which are hereby incorporated by reference to the extent not inconsistent with the claimed aspects and disclosure herein. One suitable system that can be used to deposit a metal layer 230 by an electroplating or electroless process is the Electra® system, available from Applied Materials, Inc., of Santa Clara, Calif.

Additional processing steps may be performed on the deposited metal layer 230, such as annealing, or depositing a silicon material on the metal layer 230 and then annealing to form a metal silicide.

Figure 3E:
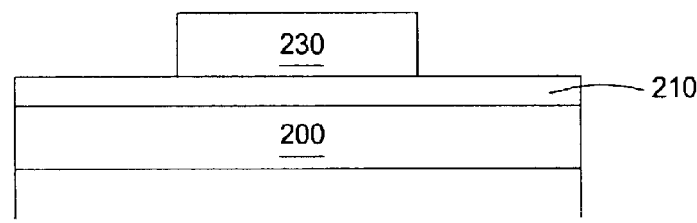
Figure 3F:
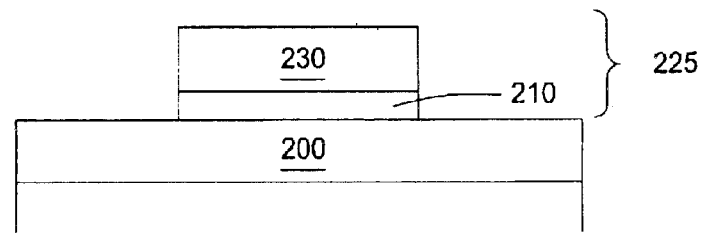

The resist material 220 is then removed from the substrate 200 at step 150 as shown in FIG. 3E. The resist material 220 and the seed material may be removed by any suitable process presently known or that may be developed. Any exposed seed layer 210 material may then be etched from the substrate surface at step 160 as shown in FIG. 3F. The remaining structure 225 of the metal layer 230 formed on the seed layer 210 comprises a metal gate for the TFT.

Figure 3G:
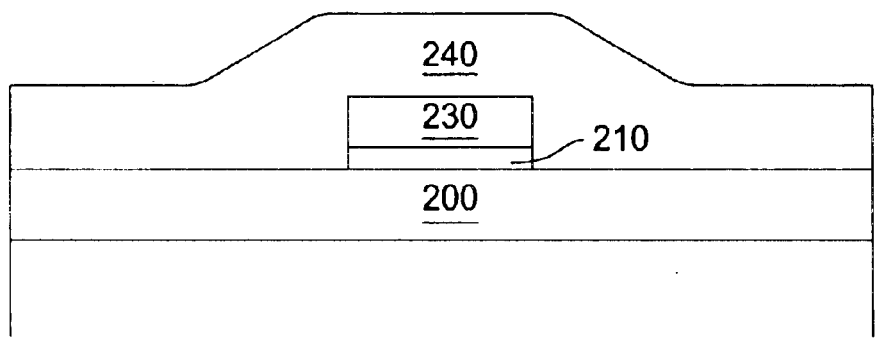

A gate dielectric layer 240 may be deposited on the metal layer 230 to electrically isolate the metal gate 230 from subsequently deposited material at step 170 as shown in FIG. 3G. The dielectric layer 240 may comprise, for example, silicon dioxide ($SiO_2$), silicon nitride (SiN), aluminum oxide ($Al_2O_3$), tantalum oxide ($Ta_2O_5$), among others. The dielectric layer 240 may be deposited to a thickness between about 20 angstroms (A) and about 5000 Å.

Figure 3H:
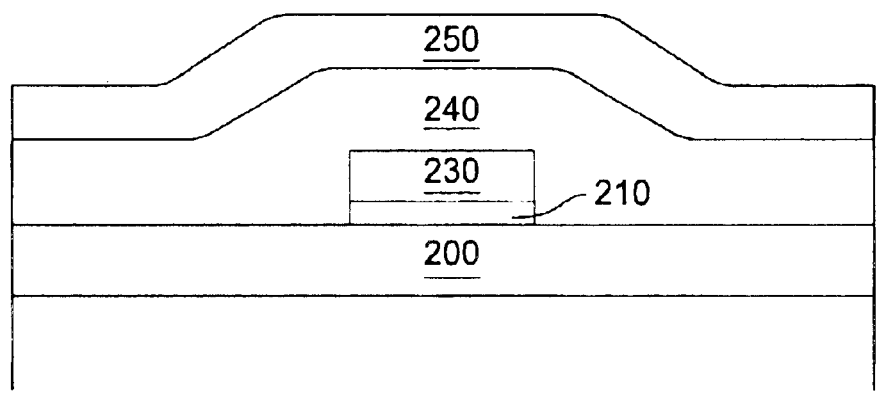

FIG. 3H shows a dielectric bulk layer 250 deposited on the dielectric layer 240. The dielectric bulk layer 250 may comprise amorphous silicon or other suitable dielectric material for forming TFTs. The bulk layer 250 may be deposited to a thickness within a range of about 20 Å to about 5000 Å, and is typically deposited to provide conformal step coverage on the dielectric layer 240. The dielectric layer 240 and the bulk layer 250 may be deposited using conventional deposition techniques such as, for example, chemical vapor deposition (CVD), plasma enhanced chemical vapor deposition (PECVD), or atomic layer deposition (ALD). Alternatively, a dielectric seed layer (not shown) may be deposited prior to the bulk layer 250. In one embodiment, the dielectric seed layer comprising silicon may be used to enhance bulk layer 250 deposition.

Figure 3I:
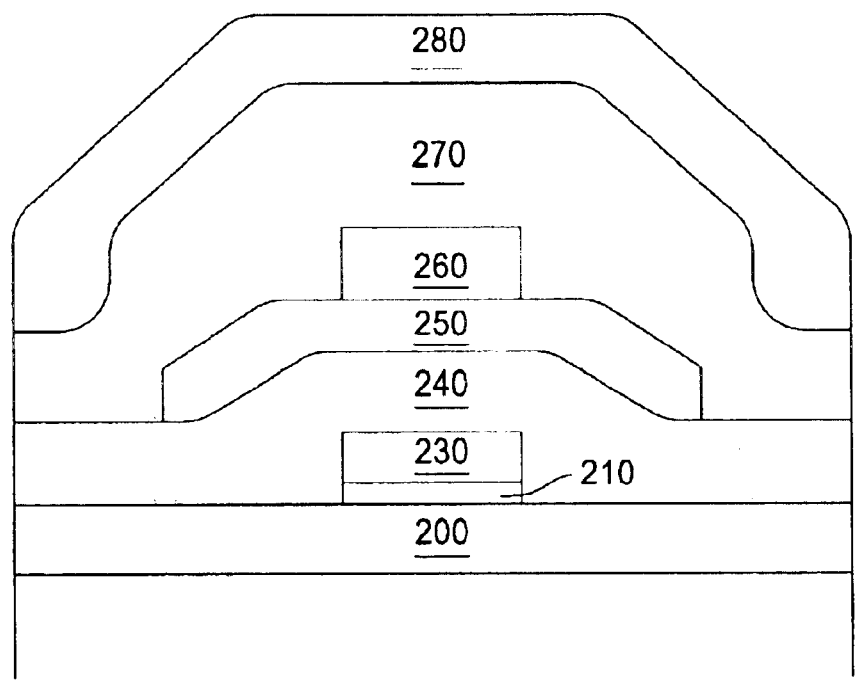

FIG. 3I shows depositing and patterning an etch stop layer 260 on bulk layer 250, depositing a doped silicon layer 270 on the etch stop layer 260 and the bulk layer 250, and depositing a conductive layer 280 on the doped silicon layer 270.

The etch stop layer 260 may comprise a dielectric material, for example, silicon nitride (SiN) having a greater etch resistance than the surrounding material. The etch stop layer 260 may be formed using, for example, plasma enhanced chemical vapor deposition, chemical vapor deposition, physical vapor deposition, or other conventional methods known to the art. The etch stop layer 260 and the bulk layer 250 are lithographically patterned and etched using conventional techniques prior to subsequent layer deposition.

The doped silicon layer 270 may be deposited to a thickness within a range between about 10 Å to about 5000 Å, for example, between of about 10 Å to about 100 Å. The doped silicon layer 270 directly contacts portions of the bulk layer 250 and forms a semiconductor junction. The conductive layer 280 may comprise a metal such as, for example, aluminum (Al), tungsten (W), molybdenum (Mo), chromium (Cr), tantalum (Ta), and combinations thereof, among others. The conductive layer 280 may be formed using conventional deposition techniques.

Figure 3J:
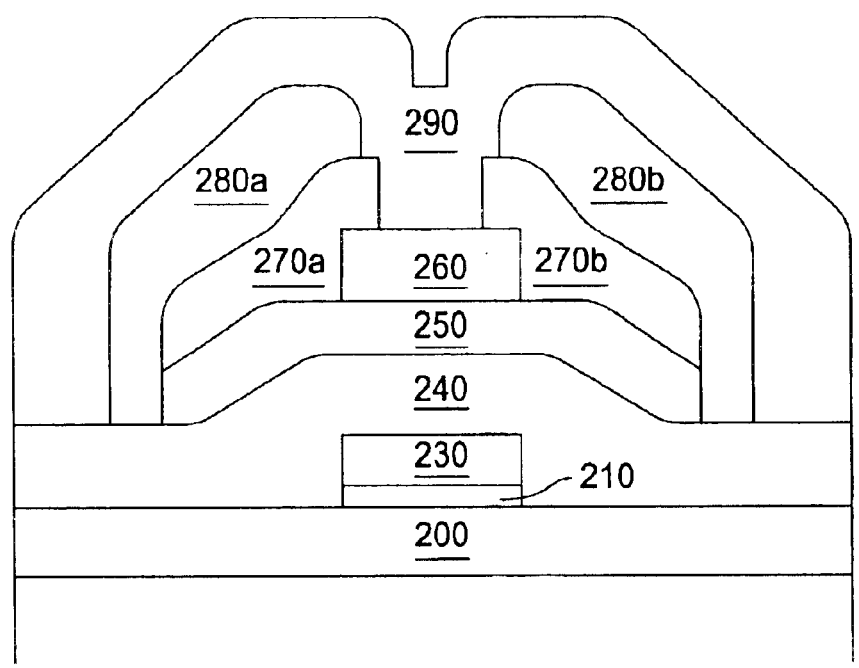

FIG. 3J shows lithographically patterning both the conductive layer 280 and the doped silicon layer 270 to define a source region 270a and a drain region 270b as well as a source contact 280a and a drain contact 280b. The source 270a and drain 270b regions of the thin film transistor are separated from one another by the stop etch layer 260. A passivation layer 290 may then be conformally deposited on the exposed surfaces of the dielectric layer 240, the source contact 270a, the drain contact 270b and the etch stop layer 260. The passivation layer 290 is generally an insulator and may comprise, for example, silicon oxide or silicon nitride, and may be formed using conventional deposition techniques. The passivation layer 290 encapsulates the thin film transistor from ambient environmental contaminants such as moisture and oxygen.

An example of the process 100 includes providing a glass substrate, such as commercially available glass substrates for flat panel displays from Corning or Asahi of Japan, depositing a nickel or copper seed layer by an electroless deposition technique to a thickness of about 0.05 μm, depositing a resist material to a thickness of about 0.2 μm on the nickel or copper seed layer, exposing the resist material to an energy source, developing the resist material to define the feature definition, electro(plating/less) depositing a copper layer on the seed layer within the features formed in the resist material to a thickness of about 0.2 μm, removing the photoresist material, removing excess seed layer materials, depositing a gate dielectric layer of silicon nitride to a thickness of about 0.4 μm, depositing a semiconductor material of amorphous silicon to a thickness of about 0.2 μm, depositing a doped silicon layer to a thickness of about 0.5 μm, depositing a conductive layer of copper to a thickness of about 0.25 μm, lithographically patterning both the conductive layer and the doped silicon layer, and optionally, depositing a passivation layer of silicon nitride to a thickness of about 0.3 μm to encapsulate the feature. The thickness of the various layers of material may vary based upon the size of the features being formed and the feature application. The examples provided herein are illustrative and should not be construed or interpreted as limiting the scope of the invention.

Subtractive Process

Figure 4:
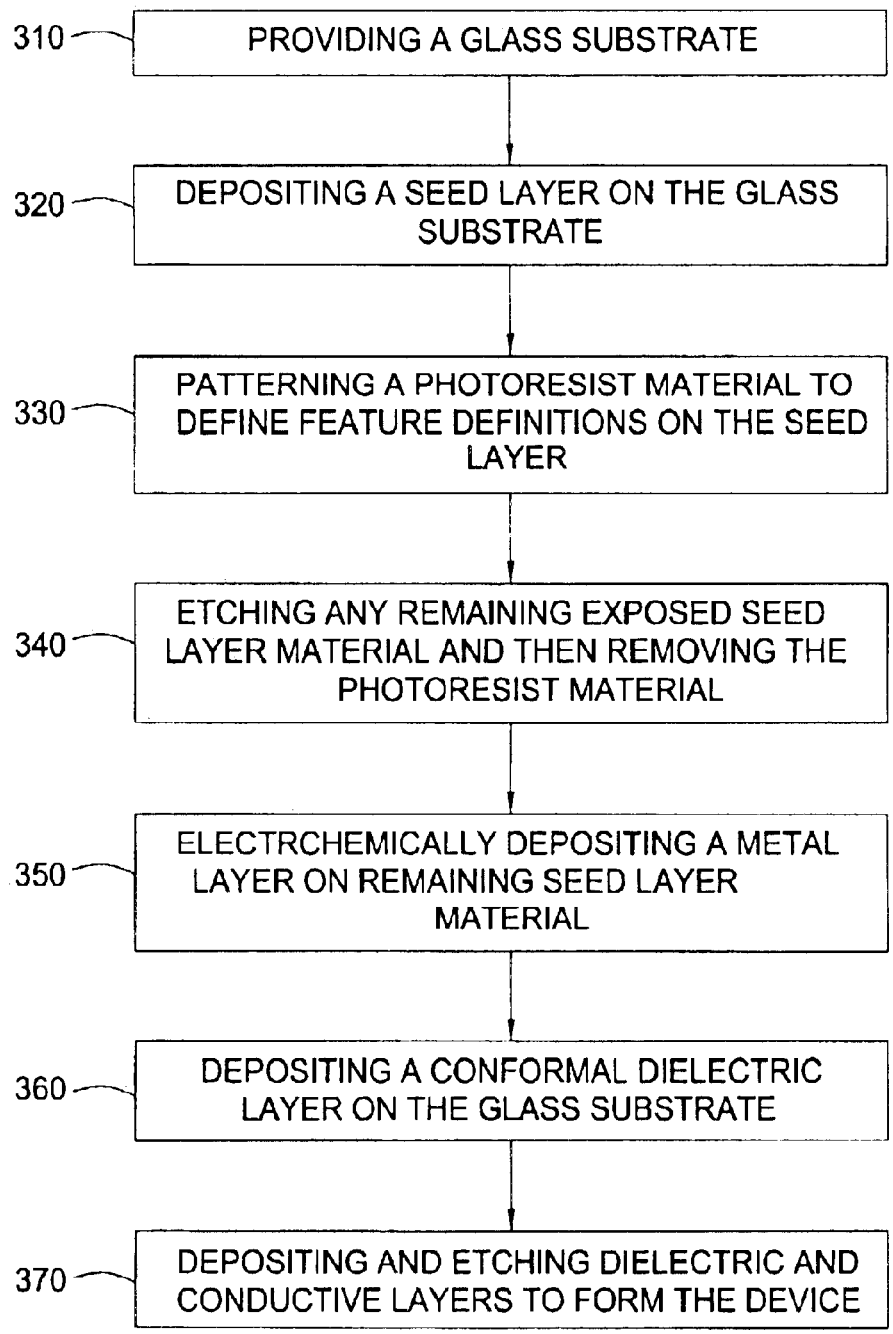
FIG. 4 is a flow chart illustrating steps undertaken in depositing layers according to another embodiment of the invention.

FIG. 4 is a flow chart illustrating steps taken in processing a substrate according to an embodiment of the invention The process 300 is described as follows. A glass substrate is provided to a processing apparatus at step 310. A nucleation or seed layer of a metal material is deposited on the glass substrate at step 320. A resist is patterned as described herein to insulate portions of the underlying seed layer at step 330. Exposed portions of the seed layer are then removed to define selective deposition sites for the subsequent metal deposition process and then any remaining photoresist material is also removed at step 340. A metal layer is then selectively deposited on the remaining portions of the seed layer by an electrochemical deposition process to form a feature extending above the plane of the glass substrate at step 350. A conformal dielectric layer Is then deposited on the feature and glass substrate at step 360. Dielectric and conductive layers may then be deposited on the substrate to form the thin film transistor (TFT) at step 370.

Figure 5A:
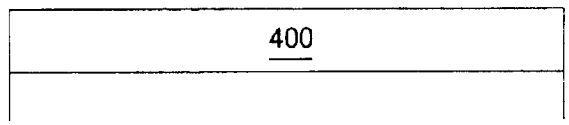
FIGS. 5A–5F are cross-sectional views of layering steps in another embodiment of the invention.

FIGS. 5A–5F are cross-sectional views of one example of forming a thin film transistor with a selectively deposited seed layer according to the process 300 illustrated in the flow chart of FIG. 4. Initially, a glass substrate 400 as described herein is provided to deposit material thereon to form the substrate at step 310 as shown in FIG. 5A. Prior to deposition of material thereon, the substrate 400 may be exposed to a cleaning process, such as a plasma clean to remove oxides, which clean may be performed in situ with the deposition of materials. An optional barrier layer as described herein may be deposited prior to seed layer deposition.

Figure 5B:
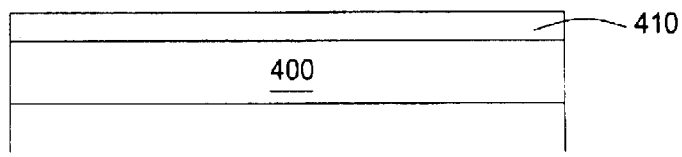

A seed layer 410 is deposited on the substrate surface at step 320 as shown in FIG. 5B. The seed layer 410 may comprise a metal or metal-containing material described herein for catalyzing or nucleating an electrochemical deposition process may be used. The seed layer 410 may be deposited by a technique described herein.

Figure 5C:
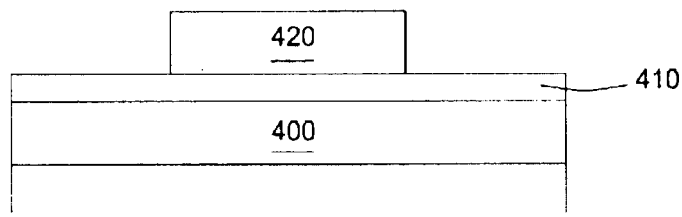

A resist layer 420 may then be patterned on the seed layer 410 to insulate underlying material of the seed layer 410 at step 330 as shown in FIG. 5C. The deposition and development of the resist may be as described herein. Alternatively, a negative resist may be used, in which the resist portion exposed to a light source is modified to resist etching rather than modified to be susceptible to removal during etching. This property change allows the same lithographic reticle for the process 100 to be used with the process 300 by simply substituting a negative photoresist for the positive photoresist as described in one embodiment for the process 100.

The resist deposited on the seed layer 410 is, for example, between about 1000 Å and about 6000 Å thick, such as between about 2000 Å and about 4000 Å thick, but may be of any thickness desired. The resist material is then treated with a developing solution to remove the modified photoresist material and insulate portions of the underlying seed layer 410.

Figure 5D:
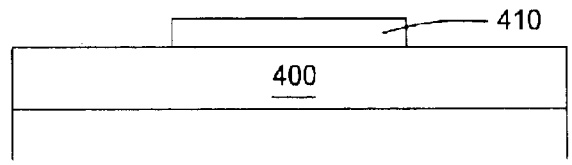

Any exposed seed layer 410 material may then be removed from the substrate surface at step 340 as shown in FIG. 5D.

Figure 5E:
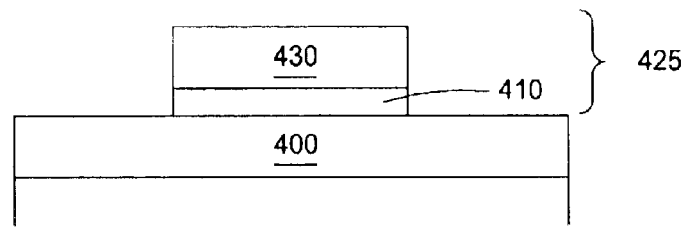

The substrate 400 may then be introduced into an apparatus and a metal layer 430 is deposited on the seed layer 410, by an electrochemical process at step 350 as shown in FIG. 5E. The electrochemical process may include electroless deposition or electroplating techniques as described herein. The metal layer 430 as described herein may be deposited to a desired thickness, for example, between about 0.01 μm and about 0.2 μm. The structure 425 of the metal layer 430 formed on the seed layer 410 comprises a metal gate for the TFT. Additional processing steps may be performed on the deposited metal layer 430, such as annealing or depositing a silicon material on the metal layer and annealing to form a metal silicide.

Figure 5F:
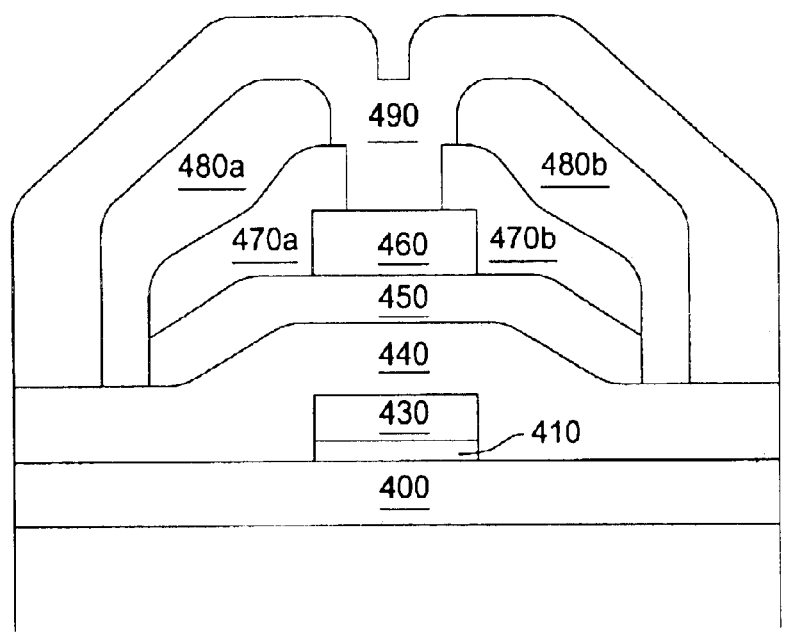

The TFT may then be completed by depositing a dielectric layer 440 on the structure 425, depositing a bulk dielectric layer 450 on the dielectric layer 440, depositing and patterning an etch stop layer 460 on bulk layer 450, depositing a doped silicon layer 470 on the etch stop layer 460 and bulk layer 450, depositing a conductive layer 480 on the doped silicon layer 470, patterning both the conductive layer 480 and the doped silicon layer 470 to define a source region 470*a* and a drain region 470*b* as well as a source contact 480*a* and a drain contact 480*b*, and depositing a passivation layer 490 on the exposed surfaces of the dielectric layer 440, the source contact 470*a*, the drain contact 470*b* and the etch stop layer 460 at step 360 as shown in FIG. 5F and as described herein.

An example of the process 300 includes providing a glass substrate, such as commercially available glass substrates for flat panel displays from Corning or Asahi of Japan, depositing a nickel or copper seed layer by an electroless deposition technique to a thickness of about 0.05 μm, depositing a resist material to a thickness of about 0.2 μm on the nickel or copper seed layer, exposing the resist material to an energy source, developing the resist material to form insulating features, removing excess seed layer materials and then removing the photoresist material, electro(plating/less) depositing a copper layer on the seed layer within the features formed in the resist material to a thickness of about 0.2 μm, depositing a gate dielectric layer of silicon nitride to a thickness of about 0.4 μm, depositing a semiconductor material of amorphous silicon to a thickness of about 0.2 μm, depositing a doped silicon layer to a thickness of about 0.5 μm, depositing a conductive layer of copper to a thickness of about 0.25 μm, lithographically patterning both the conductive layer and the doped silicon layer, and optionally, depositing a passivation layer of silicon nitride to a thickness of about 0.3 μm to encapsulate the feature. The thickness of the various layer of material may vary based upon the size of the features being formed and the feature application.

Top-Gate Thin Film Transistor

FIGS. 6A–6D illustrate cross-sectional schematic views of substrate structure 625 during different stages of a top-gate thin film transistor fabrication sequence incorporating the selective metal layer deposition techniques described herein. The top-gate thin film transistor may be, for example, a metal-oxide-semiconductor field effect transistor (MOSFET) or a junction field effect transistor (JFET). This transistor fabrication sequence is for a switch in an active matrix liquid crystal display (AMLCD), and this process depicts the formation of one of an array of switches used in an AMLCD.

Figure 6A:
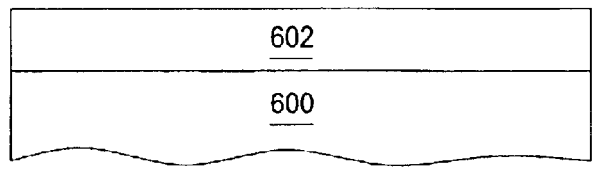
FIGS. 6A–6D are cross-sectional views of layering steps in another embodiment of the invention.

FIG. 6A, for example, illustrates a cross-sectional view of a substrate 600. The substrate 600 may comprise a glass material described herein that may be essentially optically transparent in the visible spectrum. Optionally, the substrate may have an underlayer 602 thereon, which may be an insulating material, such as, for example, silicon dioxide ($SiO_2$) or silicon nitride (SiN)

Figure 6B:
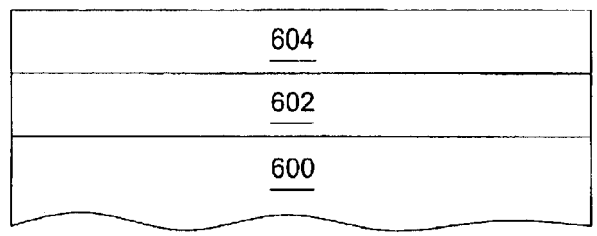

A doped semiconductor layer 604, such as silicon, is deposited as shown In FIG. 6B. The doped semiconductor layer 604 includes n-type doped regions 604n and p-type doped regions 604p. The interfaces between n-type doped regions 604n and p-type doped regions 604p are semiconductor junctions that support the ability of the thin film transistor (TFT) to act as a switching device.

Figure 6C:
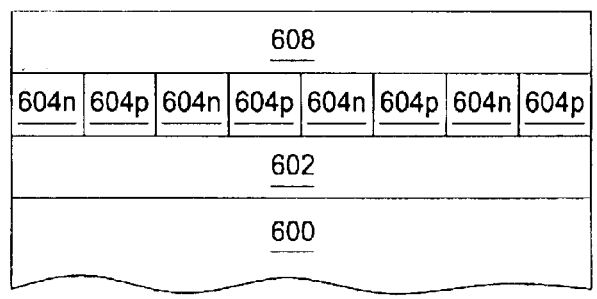

A gate dielectric layer 608 is deposited on the n-type doped regions 604n and the p-type doped regions 604p as shown in FIG. 6C. The gate dielectric layer 608 may comprise, for example, silicon oxide (SiO), aluminum oxide ($Al_2O_3$), or tantalum pentoxide ($Ta_2O_5$), among others. The gate dielectric layer 608 may be formed using conventional deposition processes.

Figure 6D:
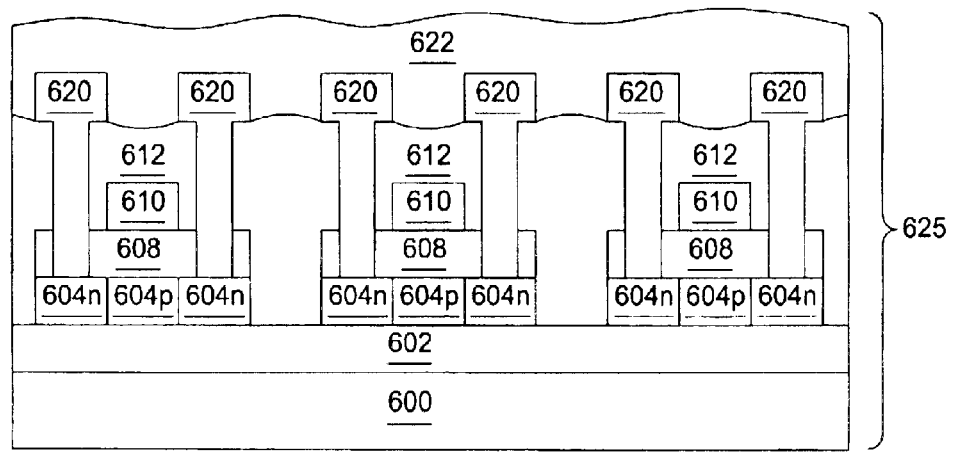

As shown in FIG. 6D, one or more metal gates 610 may be formed on the dielectric layer 608 using embodiments of the processes described herein and illustrated in FIGS. 2, 3A–3J and FIGS. 4, 5A–5F. The metal gates 610 may be formed to a thickness in the range of about 1000 Å to about 5000 Å. The metal gates 610 comprise an electrically conductive layer as described herein that controls the movement of charge carriers within the thin film transistor.

After the metal gates 610 are formed, an interlayer dielectric 612 is formed thereon. The interlayer dielectric 612 may comprise, for example, an oxide such as silicon dioxide. The interlayer dielectric 612 may be formed using conventional deposition processes.

The interlayer dielectric 612 is patterned to expose the n-type doped regions 604n and the p-type doped regions 604p. The patterned regions of the interlayer dielectric 612 are filled with a conductive material to form contacts 620. The contacts 620 may comprise a metal such as, for example, aluminum (Al), tungsten (W), molybdenum (Mo) or chromium (Cr), among others.

Thereafter, a passivation layer 622 may be formed thereon in order to protect and encapsulate a completed thin film transistor 625. The passivation layer 622 is generally an insulator and may comprise, for example, silicon oxide or silicon nitride. The passivation layer 622 may be formed using conventional deposition techniques.

An example of the top gate thin film transistor process includes providing a glass substrate, such as commercially available glass substrates for flat panel displays from Corning or Asahi of Japan, optionally depositing an underlayer of silicon nitride or silicon oxide, to a thickness between about 0.05 $\mu$m and about 0.15 $\mu$m, depositing a doped silicon layer to a thickness of about 0.05 $\mu$m, depositing a gate dielectric layer of silicon oxide to a thickness of about 0.1 $\mu$m, forming a metal gate layer from a copper or nickel or copper seed layer having a thickness of about 0.05 $\mu$m and a copper layer having a thickness of about 0.2 $\mu$m, depositing an interlayer dielectric of silicon dioxide to a thickness of about 0.25 $\mu$m, forming features therein to expose the underlying doped silicon layer, depositing a conductive layer of copper in the features, and optionally, depositing a passivation layer of silicon nitride to a thickness of about 0.3 $\mu$m to encapsulate the feature.

It Is within the scope of the invention to form other devices that have configurations of semiconductor layers that are different from those described above with reference to FIGS. 3A–3J, 5A–5F, and 6A–6D. For example, the switch for an AMLCD may be any variety of bipolar or unipolar transistor devices wherein a gate metal layer is deposited using the cyclical deposition process described herein.

Additionally, while the invention may be used to advantage by depositing the seed layer and copper layers in the same chamber, it should be understood that the seed layers and the copper layers may be deposited in separate chambers. However, it is advantageous to deposit the layers sequentially without exposing the substrate to atmosphere between the seed layer and copper layer deposition steps to prevent oxidation.

While the foregoing is directed to embodiments of the present invention, other and further embodiments of the invention may be devised without departing from the basic scope thereof, and the scope thereof is determined by the claims that follow.

What is claimed is:

1. A method of forming a transistor for use in an active matrix liquid crystal display (AMLCD), comprising:
    providing a glass substrate; and
    forming a metal gate on the glass substrate by a technique comprising:
        depositing a conductive seed layer on a surface of the glass substrate;
        depositing a resist material on the conductive seed layer;
        patterning the resist layer to expose portions of the conductive seed layer; and
        depositing a metal layer on the exposed portions of the conductive seed layer by an electrochemical deposition technique.

2. The method of claim 1, further comprising removing the resist material.

3. The method of claim 2, further comprising etching the exposed portions of the conductive seed layer.

4. The method of claim 3, further comprising:
    depositing one or more dielectric layers on the metal layer; and
    forming one or more source regions and one or more drain regions on the one or more dielectric layers.

5. The method of claim 1, wherein the electrochemical deposition technique comprises electroplating or electroless deposition.

6. The method of claim 1, wherein the seed layer comprises a metal selected from the group consisting of copper, nickel, tungsten, molybdenum, cobalt, ruthenium, titanium, zirconium, hafnium, niobium, tantalum, vanadium, chromium, manganese, iron, palladium, platinum, aluminum, and combinations thereof.

7. The method of claim 1, wherein the glass substrate comprises a material selected from the group consisting of undoped silica glass (USG), phosphorus doped glass (PSG), boron-phosphorus doped glass (BPSG), soda-lime glass, borosilicate glass, sodium borosilicate glass, alkali-metal borosilicate, aluminosilicate glass, aluminoborosilicate glass, alkaline earth aluminoborosilicate glass, alkaline earth-metal aluminoborosilicate glass, and combinations thereof.

8. The method of claim 1, further comprising depositing a barrier layer on a surface of the glass substrate prior to deposition of the seed layer.

9. The method of claim 1, wherein the seed layer is deposited by a process selected from the group of thermal chemical vapor deposition, plasma chemical vapor deposition, atomic layer deposition, evaporation, and combinations thereof.

10. A method of forming a transistor for use in an active matrix liquid crystal display (AMLCD), comprising:
   providing a glass substrate;
   depositing a conductive seed layer on a surface of the glass substrate;
   depositing a resist material on the conductive seed layer;
   patterning the resist layer to expose the conductive seed layer;
   etching exposed portions of the conductive seed layer;
   removing the resist material; and
   depositing a metal layer on remaining portions of the conductive seed layer by an electrochemical deposition technique.

11. The method of claim 10, further comprising depositing a dielectric layer on the metal layer.

12. The method of claim 10, wherein the electrochemical deposition technique comprises electroplating or electroless deposition.

13. The method of claim 10, wherein the seed layer comprises a metal selected from the group consisting of copper, nickel, tungsten, molybdenum, cobalt, ruthenium, titanium, zirconium, hafnium, niobium, tantalum, vanadium, chromium, manganese, iron, palladium, platinum, aluminum, and combinations thereof.

14. The method of claim 10, wherein the glass substrate comprises a material selected from the group consisting of undoped silica glass (USG), phosphorus doped glass (PSG), boron-phosphorus doped glass (BPSG), soda-lime glass, borosilicate glass, sodium borosilicate glass, alkali-metal borosilicate, aluminosilicate glass, aluminoborosilicate glass, alkaline earth aluminoborosilicate glass, alkaline earth-metal aluminoborosilicate glass, and combinations thereof.

15. The method of claim 10, further comprising depositing a barrier layer on a surface of the glass substrate prior to deposition of the seed layer.

16. The method of claim 10, wherein the seed layer is deposited by a process selected from the group of thermal chemical vapor deposition, plasma chemical vapor deposition, atomic layer deposition, evaporation, and combinations thereof.

17. A method of forming a transistor for use in an active matrix liquid crystal display (AMLCD), comprising:
   providing a glass substrate;
   forming one or more doped semiconductor layers having source regions and drain regions formed therein;
   forming one or more gate dielectric layers on the one or more doped semiconductor layers;
   forming one or more metal gates on the one or more gate dielectric layers by:
      depositing a conductive seed layer on one or more gate dielectric layers;
      depositing a resist material on the conductive seed layer;
      patterning the resist layer to expose portions of the conductive seed layer;
      depositing a metal layer on the exposed portions of the conductive seed layer by an electrochemical technique; and
      removing the resist material;
   depositing an Interlayer dielectric material on the substrate and over the one or more metal gates;
   patterning one or more gate dielectric layers and the interlayer dielectric material to form feature definitions exposing underlying source regions and drain regions; and
   depositing a metal layer in the feature definitions to form a contact.

18. The method of claim 17, further comprising depositing a dielectric layer on the glass substrate prior to forming a doped semiconductor layer.

19. The method of claim 17, further comprising etching exposed conductive seed layer material.

20. The method of claim 17, wherein the electrochemical deposition technique comprises electroplating or electroless deposition.

21. A method of forming a transistor for use in an active matrix liquid crystal display (AMLCD), comprising:
   providing a glass substrate:
   forming one or more doped semiconductor layers having source regions and drain regions formed therein;
   forming one or more gate dielectric layers on the one or more doped semiconductor layers;
   forming one or more metal gates on the one or more gate dielectric layers by:
      depositing a conductive seed layer on the one or more gate dielectric layers;
      depositing a resist material on the conductive seed layer;
      patterning the resist layer to expose the conductive seed layer;
      etching exposed portions of the conductive seed layer;
      removing the resist material; and
      depositing a metal layer on remaining portions of the conducive seed layer by an electrochemical technique;
   depositing an interlayer dielectric material on the substrate and over the one or more metal gates;
   patterning one or more gate dielectric layers and the interlayer dielectric material to form feature definitions exposing underlying source regions and drain regions; and
   depositing a metal layer in the feature definitions to form a contact.

22. The method of claim 21, wherein the electrochemical deposition technique comprises electroplating or electroless deposition.

* * * * *

UNITED STATES PATENT AND TRADEMARK OFFICE
CERTIFICATE OF CORRECTION

| | | |
|---|---|---|
| PATENT NO. | : 6,887,776 B2 | Page 1 of 1 |
| APPLICATION NO. | : 10/412620 | |
| DATED | : May 3, 2005 | |
| INVENTOR(S) | : Quanyuan Shang et al. | |

It is certified that error appears in the above-identified patent and that said Letters Patent is hereby corrected as shown below:

<u>In the Specification</u>

Column 5, Line 52: Before "system", insert --ECP--

Column 7, Line 24: Insert a period after "invention"

Signed and Sealed this

Fifth Day of September, 2006

JON W. DUDAS
*Director of the United States Patent and Trademark Office*